United States Patent [19]

Shimatani

[11] Patent Number: 4,999,745
[45] Date of Patent: Mar. 12, 1991

[54] ELECTRICAL EQUIPMENT CHASSIS UNIT

[75] Inventor: Shigeru Shimatani, Tokyo, Japan

[73] Assignee: Pioneer Electronic Corporation, Tokyo, Japan

[21] Appl. No.: 426,653

[22] Filed: Oct. 26, 1989

[30] Foreign Application Priority Data

Dec. 21, 1988 [JP] Japan .................... 63-166097[U]

[51] Int. Cl.⁵ ............................................. H02B 1/01
[52] U.S. Cl. .................................................. 361/429
[58] Field of Search ............... 361/390, 391, 417, 419, 361/420; 209/381; 248/560, 559, 638, 603, 604, 610, 639

[56] References Cited

U.S. PATENT DOCUMENTS

2,932,546  4/1960  Marggraf et al. ................. 312/352

FOREIGN PATENT DOCUMENTS

| 934178 | 10/1955 | Fed. Rep. of Germany . |
| 1879987 | 8/1963 | Fed. Rep. of Germany . |
| 1958529 | 2/1967 | Fed. Rep. of Germany . |
| 6922454 | 6/1969 | Fed. Rep. of Germany . |
| 2655915 | 6/1978 | Fed. Rep. of Germany . |
| 8101240 | 1/1981 | Fed. Rep. of Germany . |
| 3135224 | 3/1981 | Fed. Rep. of Germany . |
| 607271 | 4/1961 | United Kingdom . |
| 890374 | 2/1962 | United Kingdom ............... 248/559 |

*Primary Examiner*—Leo P. Picard
*Assistant Examiner*—Donald A. Sparks
*Attorney, Agent, or Firm*—Sughrue, Mion, Zinn, Macpeak & Seas

[57] ABSTRACT

A chassis unit for electrical equipment is made up of a main chassis and a sub-chassis so that a part such as a power transformer, which produces vibration, is mounted on the sub-chassis and parts such as a printed circuit board and the circuit elements disposed on it, which produce no vibration, are mounted on the main chassis. The main chassis has an opening through which, when the main chassis is combined with the sub-chassis in such a manner that the two chassis are substantially flush with each other, the part mounted on the sub-chassis is protruded above the main chassis, such that the main chassis is separated from the sub-chassis in the propagation of the vibration.

6 Claims, 3 Drawing Sheets

ELECTRICAL EQUIPMENT CHASSIS UNIT

BACKGROUND OF THE INVENTION

This invention relates to chassis units for electrical equipment, and more particularly to chassis units for audio visual devices.

It is well known in the art that in electrical equipment and, more specifically, in the amplifier of an audio visual device, a power transformer, chemical capacitors, etc. are mounted on a chassis, and the picture quality and tone quality depend greatly on the performance of the power transformer.

The power transformer is vibrated, when energized. The vibration is transmitted to the printed circuit board forming an electronic circuit, and to electronic circuit elements installed on the printed circuit board, thus adversely affecting the output signal. In order to eliminate this difficulty, an improvement has been proposed in the art so as to prevent the transmission of the vibration of the power transformer to the printed circuit board.

It is true that the transmission of the vibration of the power transformer to the electronic elements is decreased to some extent by the improvement. However, since the power transformer and the electronic elements are mounted on the same chassis, the vibration of the power transformer is still transmitted to the circuit elements, as a result of which the input and output signals are distorted, for instance, by intermodulation; that is, the tone quality and the picture quality are lowered.

SUMMARY OF THE INVENTION

In view of the foregoing, an object of the present invention is to provide a chassis unit which eliminates the propagation of vibration produced by a power transformer, etc. mounted thereon to other circuit elements.

The foregoing object and other objects of the invention have been achieved by the provision of a chassis unit for electrical equipment on which is mounted elements such as a power transformer and chemical capacitors which may produce vibration, comprising: a main chassis on which is mounted elements such as a printed circuit board and a heat sink which produce no vibration. Further, a sub-chassis is provided on which is mounted an element that produces vibration. The main chassis and sub-chassis have insulators through which the main chassis and sub-chassis are placed on the same plane surface. The main chassis has an opening through which, when the main chassis is combined with the sub-chassis, the element mounted on sub-chassis is protruded above the main chassis, whereby the main chassis is separated from the sub-chassis in the propagation of vibration.

The nature, principle and utility of the invention will become more apparent from the following detailed description when read in conjunction with the accompanying drawings, in which like parts are designated by like reference numerals.

DETAILED DESCRIPTION OF THE PREFERRED EMBODIMENTS

The preferred embodiments of the invention will now be described with reference to the accompanying drawings.

Figure 1:
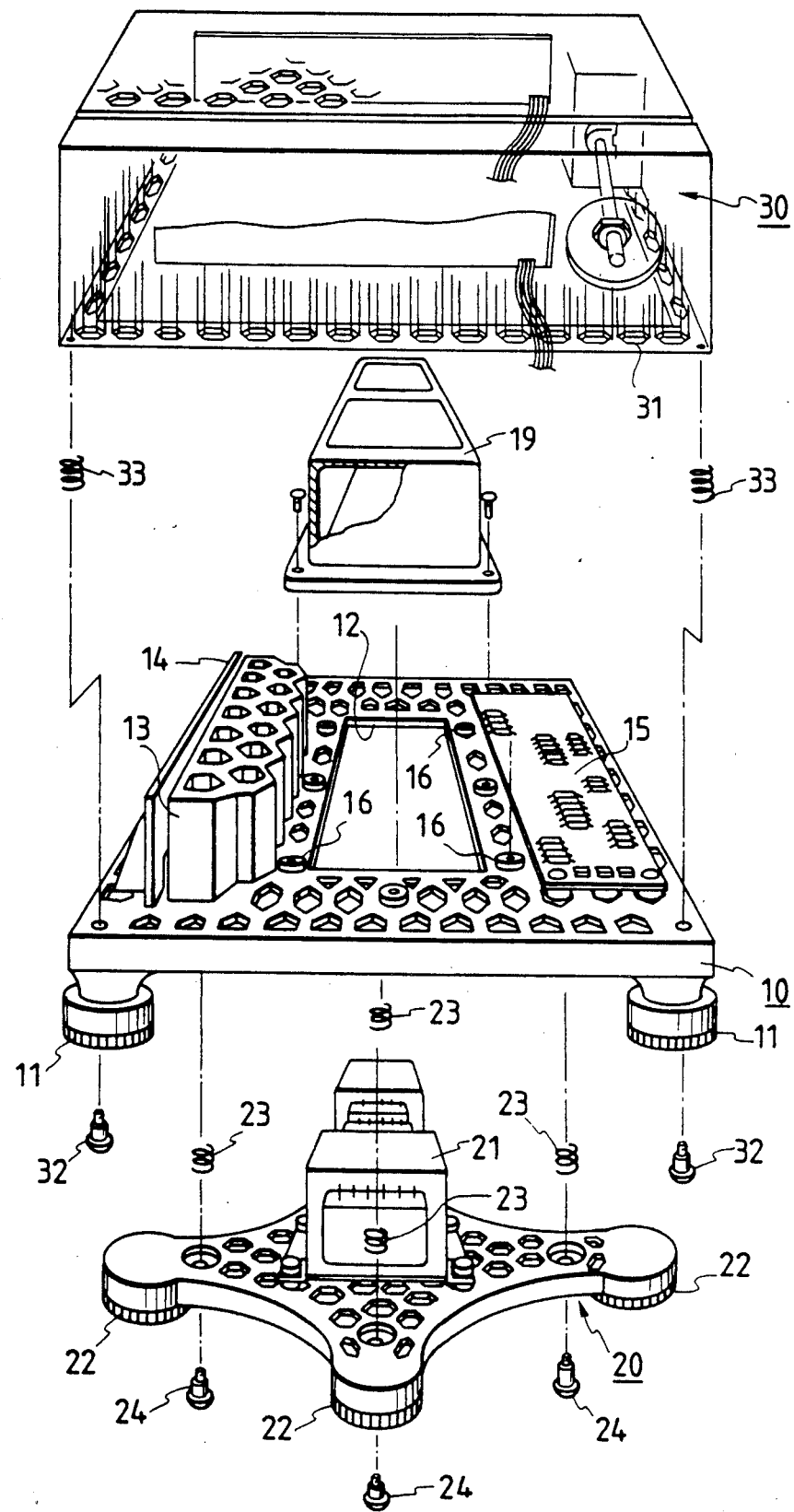
FIG. 1 is an exploded perspective view showing an embodiment of a chassis unit according to this invention.

An embodiment of a chassis unit according to the invention, as shown in FIG. 1, includes: a main chassis 10, a sub-chassis 20 and a bonnet 30.

First, the main chassis 10 will be described. The main chassis 10 is a rectangular, aluminum die cast chassis having a number of honeycomb recesses, and also having insulators 11 at the four corners. An opening 12 is formed in the central portion of the main chassis 10 in correspondence to the size of a power transformer 21 (described later). On one side of the opening 12, a heat sink 13, which is relatively large in volume, is mounted on the main chassis, and a printed circuit board 14 for a power assembly is mounted on the main chassis adjacent to the heat sink 13. On the opposite side of the opening 12, a printed circuit board 15 for an amplifier circuit is mounted on the main chassis.

The main chassis 10 has screw seats 16 at four positions around the opening 12, into which screws are engaged to secure the shield case 19 of the power transformer to the main chassis 10.

On the other hand, vibration producing circuit elements, a typical example of which is the power transformer 21, are mounted on the sub-chassis 20. The sub-chassis is also an aluminum die cast chassis having a number of honeycomb recesses, and is in the form of a cross. The sub-chassis 20 has four insulators 22 at the four outer ends, respectively, in such a manner that, when the sub-chassis is combined with the main chassis, the insulators 22 are in the plane containing the insulators 11 of the main chassis 10 and are surrounded by the insulators 11 (see FIG. 2).

The power transformer 21 is mounted on the sub-chassis 20 at the center and secured to it with screws so that it is inserted through the opening 12 of the main chassis 10 into the shield case 19.

The sub-chassis 20 is secured to the main chassis 10 with screws 24 through vibration absorbing means such as suspension coils 23, so that the sub-chassis 20 is separated from the main chassis 10 in the propagation of vibration.

The bonnet 30 is made up of walls having a number of honeycomb recesses 31 and is secured to the main chassis 10 through vibration absorbing means such as suspension coils 33 with screws 32 screwed into the insulators 11 of the main chassis 10.

Figure 2:
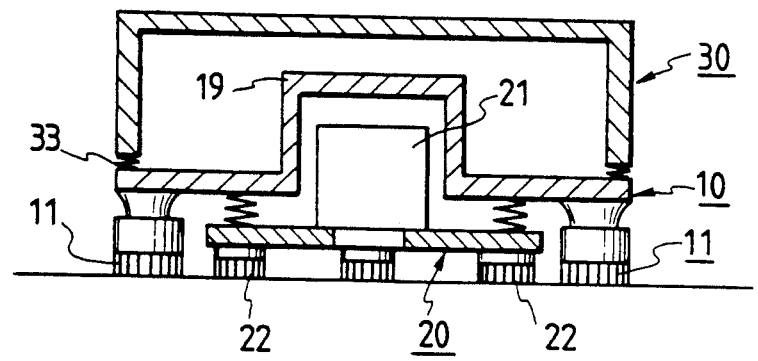
FIG. 2 is an explanatory diagram for describing the structure of the chassis unit.

As is apparent from FIG. 2, which shows an equivalent arrangement of the chassis unit of the invention, the chassis unit is made up of the main chassis 10, the sub-chassis 20, and the bonnet 30 in such a manner that they are independent of one another in the propagation of vibration, and the main chassis 10 and the sub-chassis 20 are substantially in the same plane.

Because of the above-described structure of the chassis unit, when the power switch is turned on, the vibration generated by the transformer 21 is transmitted only to the sub-chassis 20 on which the transformer 21 is mounted. In other words, since the sub-chassis 20 is separated from the main chassis 10 in the propagation of vibration, the vibration produced by the transformer 21 will not be transmitted to the electronic circuit elements on the main chassis 10.

The main chassis 10 and the sub-chassis 20 may also be made of a resin high in rigidity or a steel plate.

Figure 3:
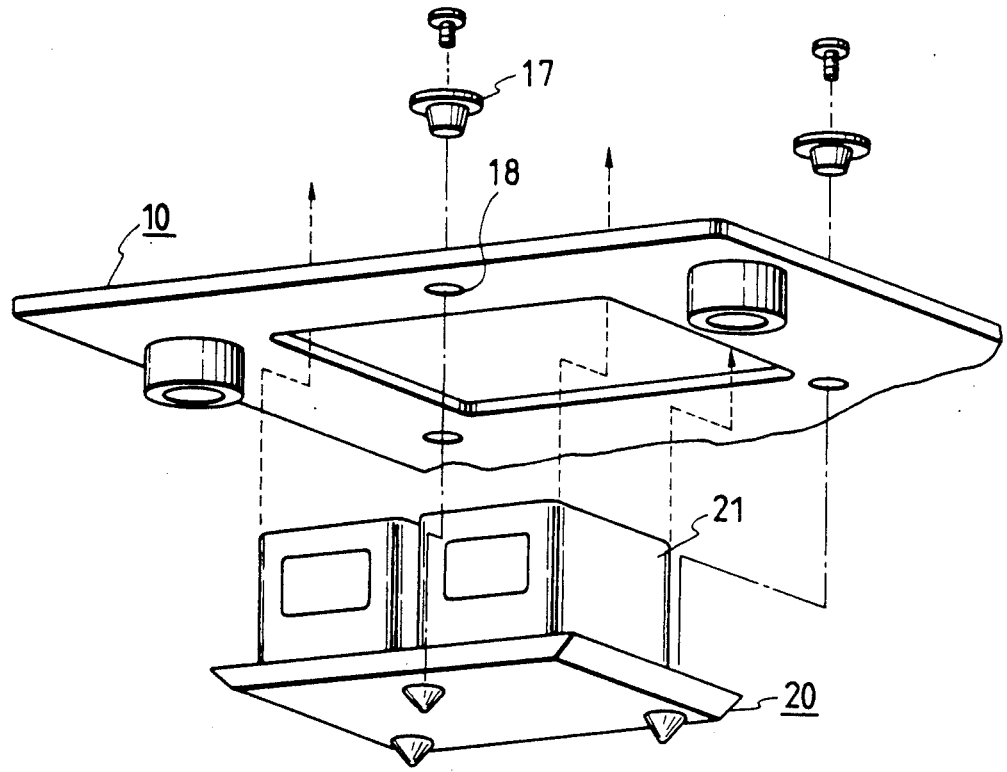
FIG. 3 is an exploded perspective view showing another embodiment of the chassis unit according to the invention.
Figure 4:
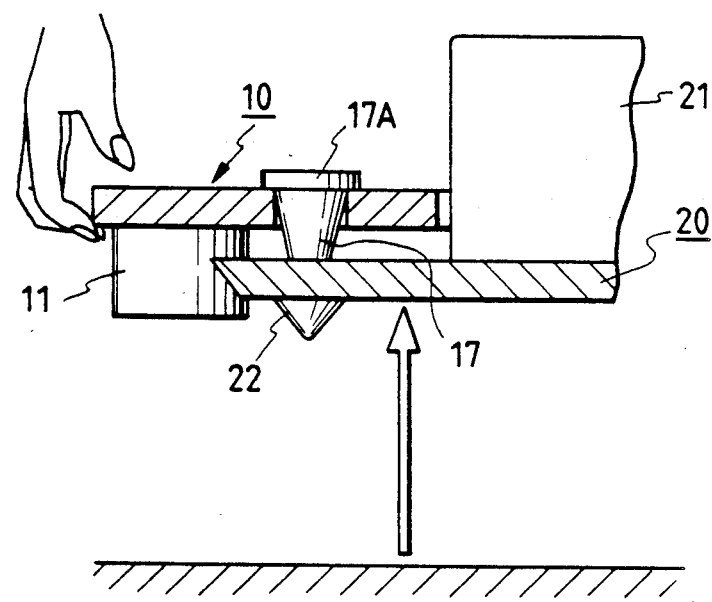
FIG. 4 is an explanatory diagram showing the chassis unit which is lifted from a mounting surface.
Figure 5:
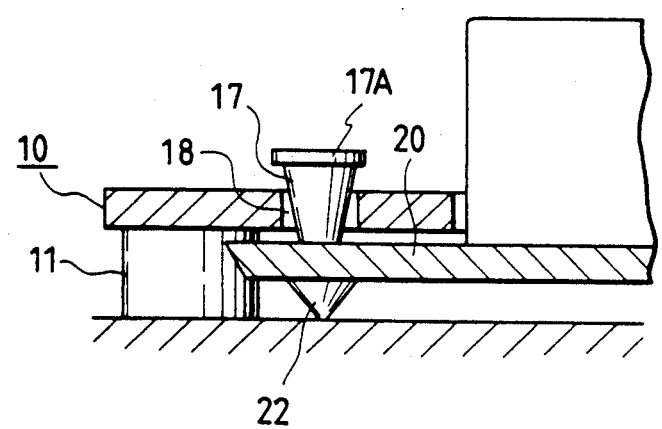
FIG. 5 is an explanatory diagram showing the chassis unit placed on the mounting surface.

Another embodiment of the chassis unit according to the invention is shown in FIGS. 3, 4 and 5. Similarly, as in the case of the first embodiment described above, the main chassis 10 and the sub-chassis 20 have their own insulators 11 and 22, respectively. The main chassis 10 has through-holes 18 where it is coupled to the sub-chassis 20 with screws (unnumbered) and conical spacers 17 which are inserted into the through-holes 18 and connected to the insulators 22 of the sub-chassis 20, respectively. When the main chassis 10 and the sub-chassis 20 are placed on the same plane, the spacers 17 are moved away from the main chassis 10, so that the main chassis 10 is completely separated from the sub-chassis 20 in the propagation of vibration. In other words, when the main chassis 10 is lifted as shown in FIG. 4, the flanges 17A of the conical spacers 17 are engaged with the main chassis 10, thus suspending the sub-chassis 20. However when the main chassis 10 and the sub-chassis 20 are placed on the same plane surface as shown in FIG. 5, the flanges 17A are disengaged from the main chassis 10, so that the main chassis 10 and the sub-chassis 20 are separated from each other.

As was described above, in the chassis unit according to the invention, the members producing vibration are installed on the sub-chassis, while the circuit elements, the operation of which are adversely affected by vibration, are mounted on the main chassis, and the main chassis and the sub-chassis are separated from each other in the propagation of vibration. Hence, with the chassis unit of the invention, the signal processing system is free from vibration in operation; that is, the lowering of the picture quality and the tone quality are positively prevented. And yet, the main chassis and the sub-chassis being combined, the resultant chassis unit is equivalent in external appearance and operation to the conventional chassis.

While there has been described a chassis unit in connection with the preferred embodiments of the invention, it will be obvious to those skilled in the art that various changes and modifications may be made therein without departing from the invention, and it is intended, therefore, to cover in the appended claims all such changes and modifications as fall within the true spirit and scope of the invention.

I claim:

1. A chassis unit for electrical equipment comprising:
   a main chassis on which is mounted electronic circuit elements that produce no vibration;
   a sub-chassis on which is mounted an electronic circuit element that produces vibration; and
   vibration absorbing means for absorbing vibration so as not to transmit the vibration from said sub-chassis to said main chassis and for combining said main chassis with said sub-chassis;
   said main chassis being independent from said sub-chassis with respect to the propagation of the vibration.

2. The chassis unit according to claim 1, wherein said main chassis and said sub-chassis each includes insulators through which said main chassis and said sub-chassis are placed on a substantially plane surface.

3. The chassis unit according to claim 1, wherein said main chassis includes an opening through which said electronic circuit element mounted on said sub-chassis is protruded above said main chassis when said main chassis is combined with said sub-chassis.

4. The chassis unit according to claim 1, wherein said vibration absorbing means includes suspension coils.

5. A chassis unit for electrical equipment comprising:
   a main chassis on which is mounted electrical elements that produce no vibration;
   a sub-chassis on which is mounted an electrical element that produces vibration; and
   vibration absorbing means for absorbing vibration so as not to transmit the vibration from said sub-chassis to said main chassis and for combining said main chassis with said sub-chassis;
   wherein said vibration absorbing means includes conical spacers, said conical spacers being moved away from said main chassis when said main chassis and said sub-chassis are placed on a substantially plane surface so as to completely separate said main chassis from said sub-chassis such that said main chassis is independent from said sub-chassis with respect to the propagation of the vibration.

6. The chassis unit according to claim 1, wherein said electronic circuit element that produces vibration comprises a power transformer.

* * * * *